United States Patent
Shiga et al.

(10) Patent No.: US 6,790,287 B2
(45) Date of Patent: Sep. 14, 2004

(54) SUBSTRATE PROCESSING APPARATUS, SUBSTRATE INSPECTION METHOD AND SUBSTRATE PROCESSING SYSTEM

(75) Inventors: Masayoshi Shiga, Kyoto (JP); Kenji Hashinoki, Kyoto (JP); Masami Ohtani, Kyoto (JP); Joichi Nishimura, Kyoto (JP)

(73) Assignee: Dainippon Screen Mfg. Co . Ltd. (JP)

( * ) Notice: Subject to any disclaimer, the term of this patent is extended or adjusted under 35 U.S.C. 154(b) by 0 days.

(21) Appl. No.: 09/942,153

(22) Filed: Aug. 29, 2001

(65) Prior Publication Data

US 2002/0189758 A1 Dec. 19, 2002

(30) Foreign Application Priority Data

| Sep. 1, 2000 | (JP) | .................................. 2000-265318 |
| Jul. 10, 2001 | (JP) | .................................. 2001-209088 |

(51) Int. Cl.$^7$ .......................... C23C 16/00; C23F 1/00; H01L 21/306
(52) U.S. Cl. ............. 118/719; 156/345.24; 156/345.31; 156/345.32; 156/345.15
(58) Field of Search ...................... 118/719; 156/345.15, 156/345.24

(56) References Cited

U.S. PATENT DOCUMENTS

| 3,765,763 | A | * | 10/1973 | Nygard | ........................ 355/100 |
| 4,185,585 | A | * | 1/1980 | Shambelan | ................ 118/50.1 |
| 5,256,204 | A | * | 10/1993 | Wu | ............................. 118/719 |
| 5,310,410 | A | * | 5/1994 | Begin et al. | ................ 29/25.01 |
| 5,417,537 | A | * | 5/1995 | Miller | ......................... 414/217 |
| 5,695,564 | A | * | 12/1997 | Imahashi | ..................... 118/719 |
| 5,766,360 | A | * | 6/1998 | Sato et al. | ................... 118/666 |
| 5,855,681 | A | * | 1/1999 | Maydan et al. | ............. 118/719 |
| 6,143,126 | A | * | 11/2000 | Stevens | ...................... 156/345 |
| 6,208,751 | B1 | * | 3/2001 | Almogy | ...................... 382/149 |
| 6,235,634 | B1 | * | 5/2001 | White et al. | ................ 438/680 |
| 6,264,748 | B1 | * | 7/2001 | Kuriki et al. | ................ 118/719 |
| 6,281,962 | B1 | * | 8/2001 | Ogata et al. | ................... 355/27 |
| 6,313,903 | B1 | * | 11/2001 | Ogata | .......................... 355/27 |
| 2002/0009658 | A1 | * | 1/2002 | Sato et al. | ..................... 430/30 |

* cited by examiner

*Primary Examiner*—Parviz Hassanzadel
*Assistant Examiner*—Karla Moore
(74) *Attorney, Agent, or Firm*—Ostrolenk, Faber, Gerb & Soffen, LLP (57) ABSTRACT

An inspection unit is provided in a substrate processing apparatus performing resist coating processing and development processing on a substrate. In the inspection unit, a film thickness measuring device, a line width measuring device, an overlay measuring device and a macro defect inspection device are successively stacked and arranged from below. The inspection unit is provided on an intermediate portion of a substrate transport path formed in the substrate processing apparatus. The substrate processed in the substrate processing apparatus is selectively introduced into each inspection part. Therefore, the apparatus can properly inspect the substrate at need while suppressing reduction of the throughput. Thus provided are a substrate processing apparatus and a substrate inspection method capable of properly inspecting a substrate while suppressing reduction of the throughput.

12 Claims, 8 Drawing Sheets

SUBSTRATE PROCESSING APPARATUS, SUBSTRATE INSPECTION METHOD AND SUBSTRATE PROCESSING SYSTEM

BACKGROUND OF THE INVENTION

1. Field of the Invention

The present invention relates to a substrate processing apparatus, a substrate inspection method and a substrate processing system successively transporting a semiconductor substrate, a glass substrate for a liquid crystal display, a glass substrate for a photomask or a substrate for an optical disk (hereinafter simply referred to as "substrate") between a plurality of processing parts along a prescribed procedure thereby performing processing such as resist coating processing and development processing while inspecting the substrate.

2. Description of the Background Art

As well known in the art, a product such as a semiconductor device or a liquid crystal display is manufactured by performing a series of processing such as cleaning, resist coating, exposure, development, etching, formation of an interlayer isolation film, heat treatment and dicing on the aforementioned substrate. In order to maintain the quality of such a semiconductor product or the like, it is important to perform various inspections on the substrate after the process of the aforementioned processing, thereby confirming the quality.

For example, a substrate processing apparatus (the so-called coater and developer) performing resist coating processing and development processing generally performs an inspection such as pattern line width measurement on the substrate in the final step of the development processing.

In general, however, a waiting time for introduction into an inspection apparatus is necessary while a certain degree of time is required for ascertaining the result of the inspection, and hence a considerable number of substrates introduced into the apparatus subsequently to a certain substrate are completely processed before the inspection result as to this substrate is recognized. When the inspection result is unsatisfactory, therefore, the considerable number of substrates must be re-processed, to result in reduction of the throughput of the overall processing.

When inspecting the substrate in the final step of the development processing as in the aforementioned coater and developer, a considerable time is required for specifying a step causing inconvenience in the inspection result, leading to reduction of the throughput also in this case.

Due to the considerable time required for recognizing the inspection result, it is also difficult to properly change (feed forward control or feedback control) processing conditions on the basis of the inspection result.

While the problematic processing step can be reliably specified and the number of substrates requiring re-processing can be reduced when inspecting a certain substrate every time a processing step is ended, the throughput of the apparatus is extremely reduced in this case, leading to increase of the cost for the processing.

In other words, the substrate cannot be properly inspected without reducing the throughput in general.

SUMMARY OF THE INVENTION

The present invention is directed to a substrate processing apparatus successively transporting a substrate between a plurality of processing parts thereby performing prescribed processing on the said substrate.

According to the present invention, a substrate processing apparatus successively transporting a substrate between a plurality of processing parts thereby performing prescribed processing on the substrate comprises a transport robot successively transporting the substrate between the plurality of processing parts along a prescribed procedure and a plurality of inspection parts, performing substrate inspections of different contents respectively, provided in the substrate processing apparatus.

The substrate processing apparatus comprises the plurality of inspection parts performing substrate inspections of different contents respectively, whereby the substrate cap be properly inspected in the apparatus at need so that proper substrate inspections can be performed while suppressing reduction of the throughput.

According to a preferred embodiment of the present invention, the transport robot successively transports a set of plural substrates along the same procedure so that the set of plural substrates are subjected to the same processing, and the transport robot transports each of part or all of the set of plural substrates to a single inspection part selected from the plurality of inspection parts thereby transporting at least one of the set of plural substrates to each of the plurality of inspection parts.

At least one of the set of plural substrates is transferred to each of the plurality of inspection parts, whereby all of a plurality of inspections can be successively performed as to the whole of the set of plural substrates by simply adding a single step for an inspection as to each substrate, whereby properly excellent throughput and necessary and sufficient inspections can be compatibly attained as a result.

According to another preferred embodiment of the present invention, a transport path is formed along the procedure, and each of the plurality of inspection parts is arranged on an intermediate position in the transport path responsive to the inspection contents thereof.

The transport path may not be changed for inspecting the substrate but reduction of the throughput can be suppressed.

According to still another embodiment of the present invention, a substrate processing apparatus successively transporting a substrate between a plurality of processing parts thereby performing prescribed processing on the substrate comprises a transport part successively transporting the substrate between the plurality of processing parts along a prescribed procedure, a plurality of inspection parts performing prescribed inspections on the substrate, a procedure setting part capable of individually incorporating substrate transportation to the plurality of inspection parts into an arbitrary order position in the procedure and a transportation control part controlling the transport part to successively transport the substrate along the procedure set by the procedure setting part.

Substrate transportation to the said plurality of inspection parts can be individually incorporated into an arbitrary order position in the procedure, whereby the degree of freedom of the inspections on the substrate can be improved.

The present invention is also directed to a substrate inspection method inspecting a substrate.

The present invention is also directed to a substrate processing system performing prescribed processing on a substrate.

Accordingly, an object of the present invention is to provide a substrate processing technique capable of properly inspecting a substrate while suppressing reduction of the throughput.

Another object of the present invention is to provide a substrate processing technique capable of improving the degree of freedom of an inspection on a substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described in detail with reference to the drawings.

Figure 1:
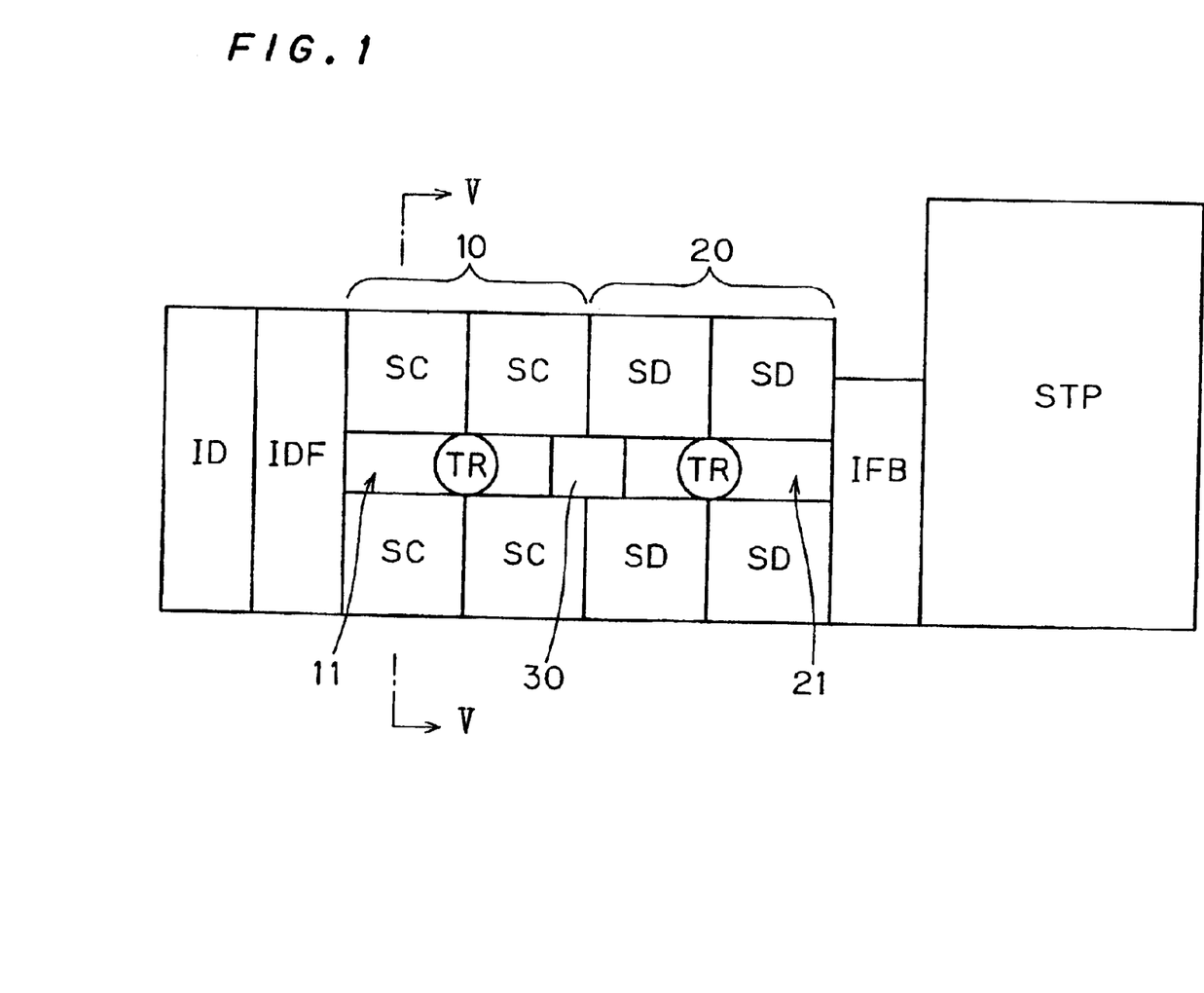
FIG. 1 is a plan view showing the arrangement/structure of a substrate processing apparatus according to the present invention.

FIG. 1 is a plan view showing the arrangement/structure of a substrate processing apparatus according to the present invention. This substrate processing apparatus, performing photoresist coating processing and development processing on a substrate, comprises coating units 10 performing resist coating processing, development units 20 performing development processing, an indexer ID introducing the substrate into the processing units 10 and 20, an indexer transfer part IDF and an interface IFB. In the substrate processing apparatus, an inspection unit 30 is arranged between the coating units 10 and the development units 20. Further, an exposure unit STP (the so-called stepper) performing exposure processing is arranged outside the substrate processing apparatus, in contact with the interface IFB.

Two pairs of coating parts SC are provided in the coating units 10 through a transport path 11 provided with a transport robot TR. Each coating part SC is the so-called spin coater dripping photoresist on the main surface of the substrate while rotating the substrate thereby performing uniform resist coating.

Figure 2:
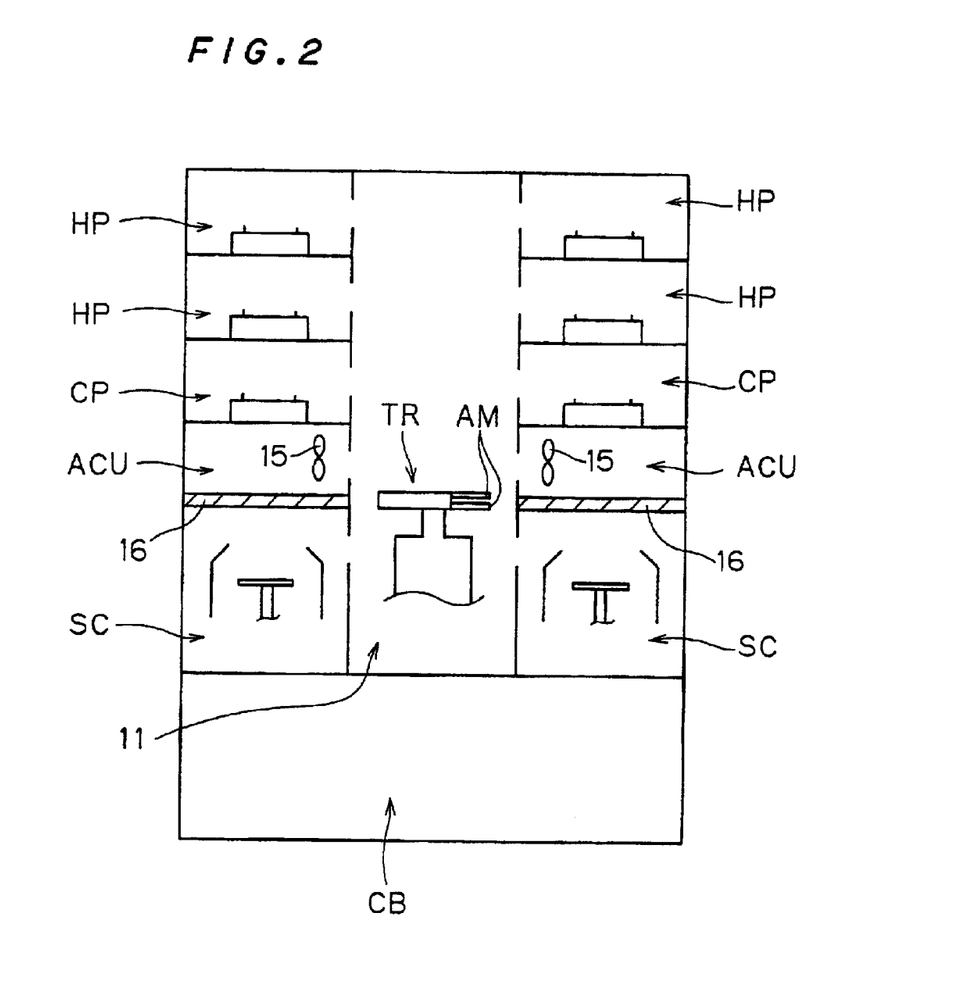
FIG. 2 is a longitudinal sectional view of the substrate processing apparatus taken along the line V—V in FIG. 1.

FIG. 2 is a longitudinal sectional view of the substrate processing apparatus taken along the line V—V in FIG. 1. As shown in FIG. 2, heat treatment parts stacked in three stages, i.e., cooling parts CP, heating parts HP and heating parts HP are successively provided from below above the respective coating parts SC. The heating parts HP are the so-called hot plates heating the substrate to a prescribed temperature. The cooling parts CP are the so-called cool plates cooling the substrate to a prescribed temperature while keeping the substrate at this prescribed temperature.

Air conditioning parts ACU for supplying clean air to the coating parts SC are provided immediately above the coating parts SC (between the coating parts SC and the cooling parts CP). The air conditioning parts ACU comprise fans 15 and ULPA filters 16. The fans 15 are driven for forcibly sucking air into the air conditioning parts ACU from an air flow (down flow) of clean air formed in the transport path 11. The ULPA filters 16 remove particles from the clean air sucked into the air conditioning parts ACU, for thereafter supplying the clean air to the coating parts SC.

A chemical cabinet CB is provided under the coating parts SC. This chemical cabinet CB stores a chemical bottle of photoresist or the like and a pipe for supplying the photoresist therein.

The transport robot TR is vertically movable and rotatable about the vertical direction by a driving mechanism (not shown). The transport robot TR comprises a transport arm AM for holding the substrate and reciprocating in a horizontal plane thereby accessing the aforementioned respective processing parts (the coating parts SC, the cooling parts CP and the heating parts HP). The transport robot TR can introduce the substrate into the respective processing parts of the coating units 10 and discharge the substrate from the respective processing parts. The transport arm AM is preferably formed by a double arm, in order to improve the throughput.

Referring again to FIG. 1, the development units 20 are provided with two pairs of development parts SD through a transport path 21 provided with a transport robot TR. The development parts SD are the so-called spin developers supplying a developer onto the exposed substrate thereby performing development. The development units 20 are connected with the coating units 10 so that the transport paths 11 and 21 align with each other.

Heat treatment parts stacked in three stages, i.e., cooling parts CP, heating parts HP and heating parts HP are successively provided from below above the respective development parts SD, similarly to the coating parts SC (see FIG. 2). An air conditioning part ACU is provided for supplying clean air to the development parts SD and a transport robot TR is arranged on the transport path 21, also similarly to the coating units 10. However, the development units 20 are provided with post-exposure baking parts PEB partially substituting for the heating parts HP. According to this embodiment, the transport robots TR for both of the coating units 10 and the development units 20 correspond to the transport part.

The indexer ID is loaded with a carrier (not shown) capable of storing a plurality of substrates, for introducing unprocessed substrates into the coating units 10 etc. from the carrier while receiving processed substrates from the coating units 10, the development units 20 etc. and storing the same in the carrier. The carrier may be an OC (open cassette) exposing the stored substrates to the outside air or an FOUP (front opening unified pod) storing the substrates in a closed space.

The indexer ID is connected with the coating units 10 through the indexer transfer part IDF. The indexer transfer part IDF transfers the substrates between the indexer ID and the coating units 10. More concretely, the indexer transfer part IDF is provided with a substrate transfer robot (not shown), which extracts the unprocessed substrates stored in the carrier of the indexer ID and transfers the same to the transport robot TR for the coating units 10 while storing the processed substrates received from the transport robot TR in the carrier of the indexer ID.

The interface IFB is arranged between the exposure unit STP and the development units 20. This interface IFB connects the exposure unit STP and the development units 20 with each other while transferring the substrates therebetween. More concretely, the interface IFB is provided with a substrate transfer robot (not shown) and a buffer cassette (not shown), for receiving resist-coated substrates from the transport robot TR for the development units 20 and introducing the same into the exposure unit STP while receiving exposed substrates from the exposure unit STP and transferring the same to the transport robot TR for the development units 20. The interface IFB may also save unprocessed substrates in the buffer cassette thereby adjusting displacement between processing times in the exposure unit STP and the substrate processing apparatus.

The exposure unit STP applies an excimer laser beam or the like to the main surfaces of the substrates coated with the photoresist thereby exposing a prescribed pattern.

In the substrate processing apparatus according to this embodiment, the inspection unit 30 is set on the portion connecting the coating units 10 and the development units 20 with each other, to extend over both transport paths 11 and 12.

Figure 3:
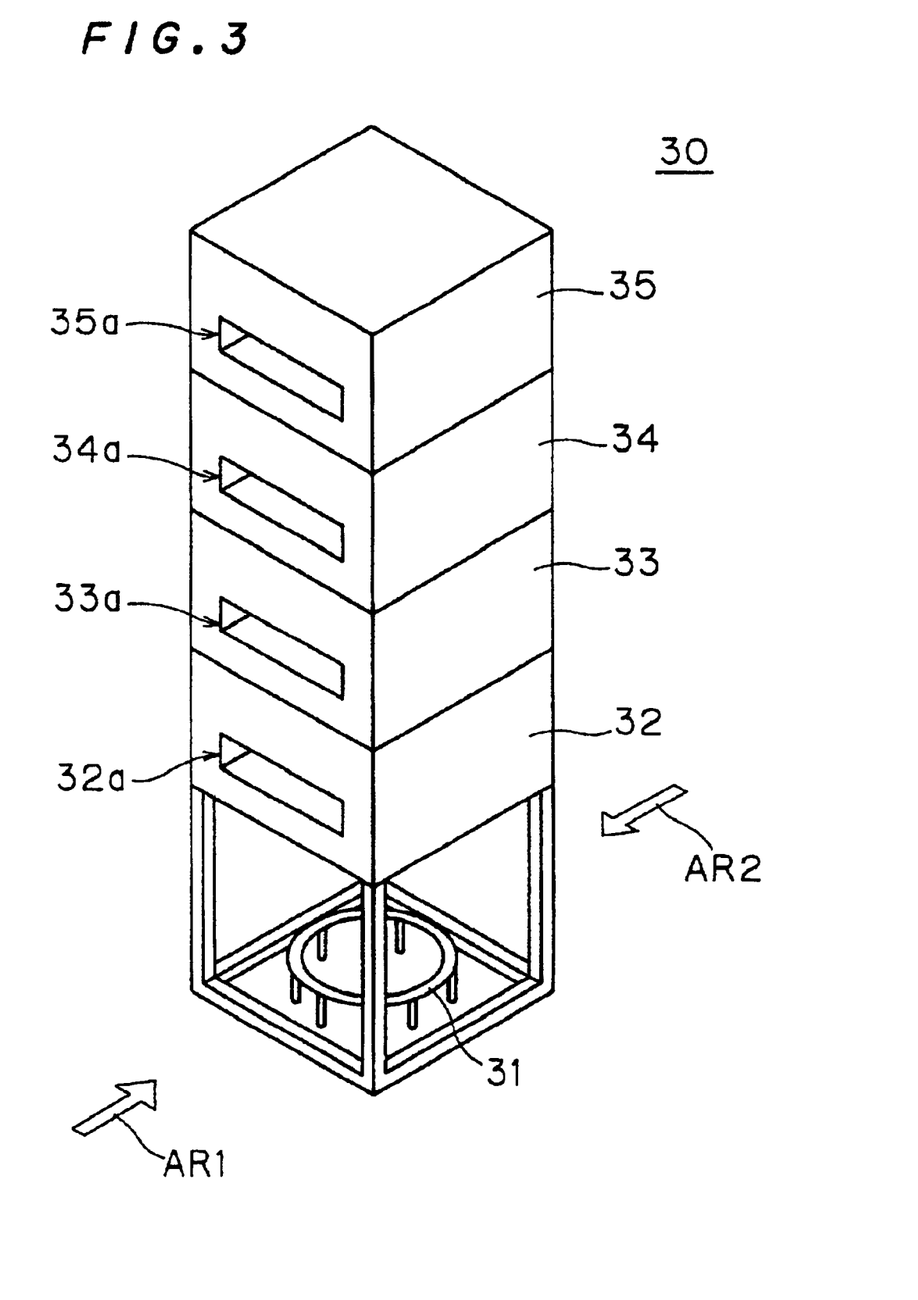
FIG. 3 is a perspective view showing an inspection unit of the substrate processing apparatus shown in FIG. 1.

FIG. 3 is a perspective view showing the inspection unit 30. The inspection unit 30 is formed by successively stacking and arranging a film thickness measuring device 32, a line width measuring device 33, an overlay measuring device 34 and a macro defect inspection device 35 from below. A transfer table 31 is provided on the lowermost stage of the inspection unit 30 (under the film thickness measuring device 32). The transport robots TR for the coating units 10 and the development units 20 access the inspection unit 30 along arrows AR1 and AR2 in FIG. 3 respectively.

The transfer table 31 is capable of receiving the substrates. As shown in FIG. 3, the periphery of the transfer table 31 is open so that the transport robots TR for the coating units 10 and the development units 20 can place the substrates on the transfer table 31 and take out substrates placed on the transfer table 31. Thus, the transport robots TR for the coating units 10 and the development units 20 can transfer the substrates to each other through the transfer table 31. The transfer table 31 is merely employed for transferring the substrates between the transport robots TR.

The film thickness measuring device 32 is an inspection device measuring the thickness of a resist film applied onto each substrate. The film thickness measuring device 32 is provided with an inlet/outlet port 32a on its side surface, so that the transport robot TR for the coating units 10 can introduce/discharge substrates into/from the film thickness measuring device 32 through the inlet/outlet port 32a. A similar inlet/outlet port is provided also on the side surface of the film thickness measuring device 32 opposite to that provided with the inlet/outlet port 32a, so that the transport robot TR for the development units 20 can introduce/discharge substrates into/from the film thickness measuring device 32 through the inlet/outlet port. Therefore, the transport robot TR for the coating units 10 can introduce a resist-coated substrate so that the film thickness measuring device 32 performs film thickness measurement on this substrate and the transport robot TR for the development units 20 can discharge the inspected substrate, for example.

The line width measuring device 33 is an inspection device measuring the line width of the pattern formed on each substrate. The line width measuring device 33 is provided with an inlet/outlet port 33a on its side surface, so that the transport robot TR for the coating units 10 can introduce/discharge substrates into/from the line width measuring device 33 through the inlet/outlet port 33a. A similar inlet/outlet port is provided also on the side surface of the line width measuring device 33 opposite to that provided with the inlet/outlet port 33a, so that the transport robot TR for the development units 20 can introduce/discharge substrates into/from the line width measuring device 33 through the inlet/outlet port. Therefore, the transport robot TR for the development units 20 can introduce a developed substrate so that the line width measuring device 33 performs line width measurement on this substrate and the transport robot TR for the coating units 10 can discharge the inspected substrate, for example.

The overlay measuring device 34 is an inspection device measuring displacement of the pattern formed on each substrate. Similarly to the above, the overlay measuring device 34 is provided with an inlet/outlet port 34a on its side surface, so that the transport robot TR for the coating units 10 can introduce/discharge substrates into/from the overlay measuring device 34 through the inlet/outlet port 34a. A similar inlet/outlet port is provided also on the side surface of the overlay measuring device 34 opposite to that provided with the inlet/outlet port 34a, so that the transport robot TR for the development units 20 can introduce/discharge substrates into/from the overlay measuring device 34 through the inlet/outlet port.

The macro defect inspection device 35 is an inspection device determining presence/absence of a relatively large defect appearing on each substrate such as adhesion of particles, for example. Similarly to the above, the macro defect inspection device 35 is provided with an inlet/outlet port 35a on its side surface, so that the transport robot TR for the coating units 10 can introduce/discharge substrates into/from the macro defect inspection device 35 through the inlet/outlet port 35a. A similar inlet/outlet port is provided also on the side surface of the macro defect inspection device 35 opposite to that provided with the inlet/outlet port 35a, so that the transport robot TR for the development units 20 can introduce/discharge substrates into/from the macro defect inspection device 35 through this inlet/outlet port.

Thus, the substrate processing apparatus according to this embodiment is provided therein with four inspection parts performing substrate inspections of different contents respectively. In this embodiment, the development parts SD, the coating parts SC, the cooling parts CP, the heating parts HP and the post-exposure baking parts PEB are generically referred to as "processing parts". Throughout the specification, it is assumed that the wording "processing" stands for substrate processing (coating processing, development processing, heat treatment etc., for example) excluding inspections.

Figure 4:
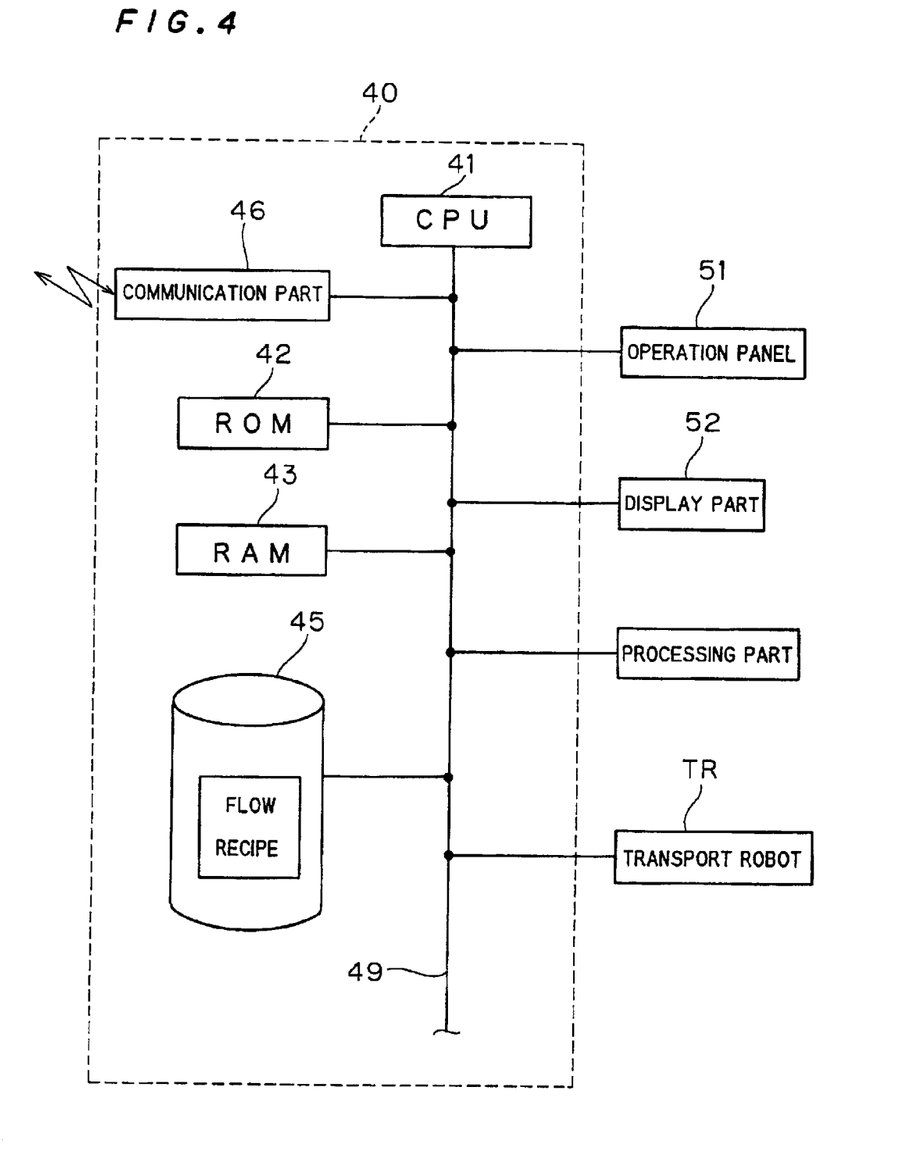
FIG. 4 is a functional block diagram for illustrating a control mechanism of the substrate processing apparatus shown in FIG. 1.

FIG. 4 is a functional block diagram for illustrating a control mechanism of the aforementioned substrate processing apparatus. The substrate processing apparatus comprises a control part 40 for controlling the overall apparatus therein. The control part 40, formed by a computer, comprises a CPU 41 forming a main body part of the control part 40 for performing arithmetic processing, a ROM (read-only memory) 42, a RAM (random-access memory) 43, a magnetic disk 45 storing control software, data etc., and a communication part 46 communicating with a host computer or the like provided outside the substrate processing apparatus. The CPU 41 is electrically connected with the magnetic disk 45, the communication part 46 etc. through a bus line 49. The bus line 49 of the control part 40 is also connected with an operation panel 51 of the substrate processing apparatus, a display part 52, the processing parts, the transport robots TR and the like. The processing parts and the transport robots TR are described above.

The operation panel 51 is formed by a keyboard or the like provided on the outer wall surface of the substrate processing apparatus. The display part 52 is a display provided in association with the operation panel 51. An operator can enter a command, parameters etc. from the operation panel 51 while confirming contents displayed on the display part 52. The operation panel 51 and the display part 52 may alternatively be integrally formed as a touch panel.

The operator can also set/input a flow recipe describing the procedure of substrate processing from the operation panel 51. The magnetic disk 45 stores the input flow recipe. The CPU 41 of the control part 40 controls the transport robots TR according to the flow recipe stored in the magnetic disk 45, and makes the transport robots TR transport substrates along the procedure described in the flow recipe. The details of the flow recipe are described later.

Figure 5:
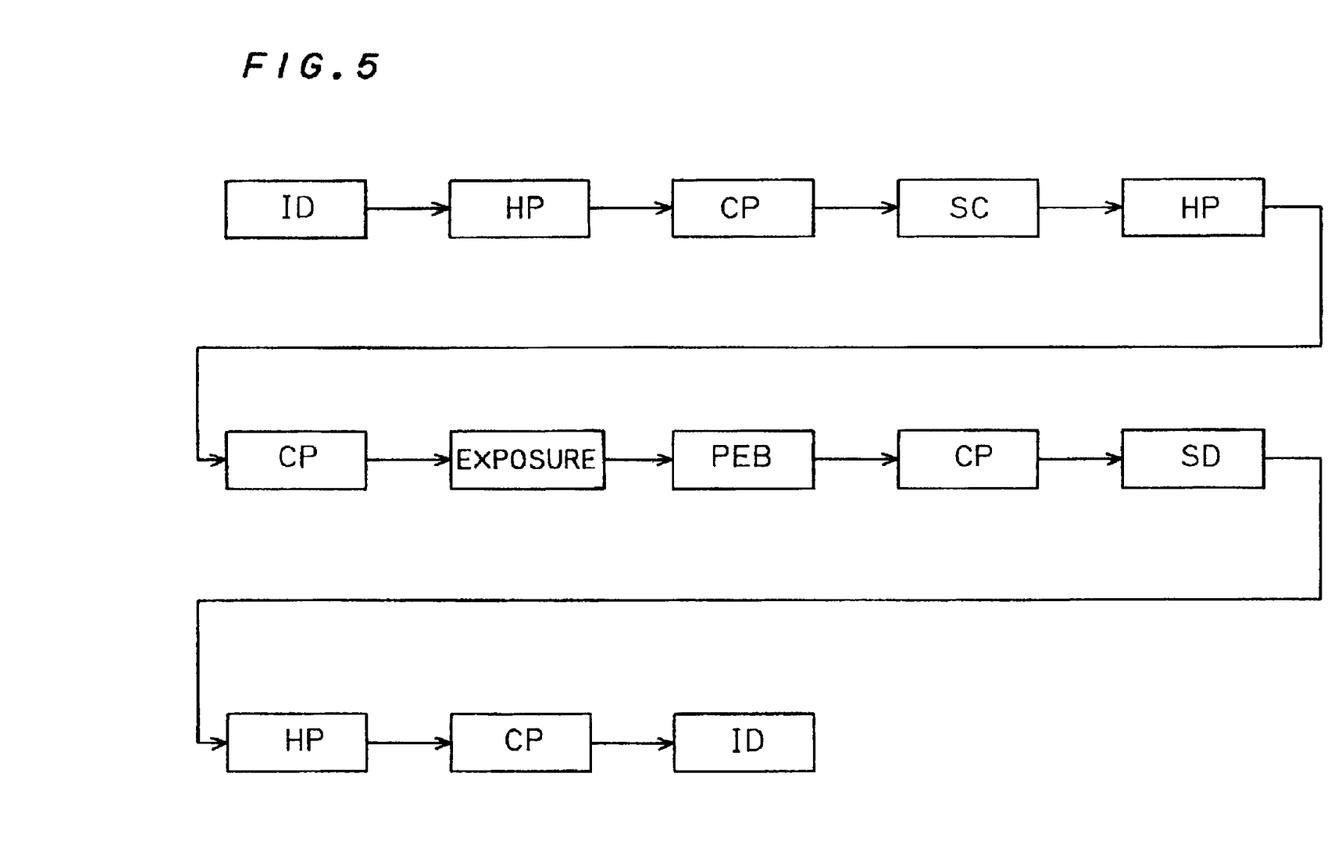
FIG. 5 illustrates an exemplary procedure in the substrate processing apparatus shown in FIG. 1.

Processing in the substrate processing apparatus having the aforementioned structure is now described. First, the outline of a general procedure excluding inspections is described. FIG. 5 illustrates an exemplary procedure (excluding inspections) in the substrate processing apparatus.

An unprocessed substrate stored in the carrier of the indexer ID is transferred to the transport robot TR for the coating units 10 by the indexer transfer part IDF, to be introduced into any heating part HP of either coating unit 10. The heating part HP heats the substrate mainly for reinforcing adhesion in resist coating. The heated substrate is introduced into any cooling part CP by the transport robot TR for the coating units 10 and cooled therein, and thereafter introduced into any coating part SC. The two pairs of coating parts SC are capable of parallel processing, and each substrate can be arbitrarily introduced into any of the coating parts SC. This also applies to the remaining processing parts.

The substrate coated with the resist in the coating part SC is subjected to post-coating heat treatment by any heating part HP and any cooling part CP in either coating unit 10. Thereafter this substrate is introduced into the exposure unit STP through the transport robot TR for the development units 20 and the interface IFB. The substrate subjected to pattern exposure by the exposure unit STP is returned to the transport robot TR for the development units 20 through the interface IFB, and introduced into any post-exposure baking part PEB in either development unit 20. The post-exposure baking part PEB heats the substrate mainly for activating post-exposure acid reaction. The substrate completely subjected to post-exposure baking is introduced into any cooling part CP by the transport robot TR for the development units 20 and cooled therein, and thereafter introduced into any development unit SD.

The substrate developed in the development part SD is subjected to post-development heat treatment by any heating part HP and any cooling part CP in either development unit 20. Thereafter this substrate is transferred from the transport robot TR for the development units 20 to the transport robot TR for the coating units 10, and stored in the carrier of the indexer ID as a processed substrate through the indexer transfer part IDF.

In this embodiment, as hereinabove described, the two transport robots TR serving as transport parts transport each substrate along the basic procedure shown in FIG. 5 between the plurality of processing parts thereby performing resist coating processing and development processing on the substrate. The two transport robots TR successively transport a set of plural substrates (25 substrates, for example) stored in the single carrier loaded on the indexer ID totally along the procedure shown in FIG. 5, thereby performing the same processing.

The CPU 41 of the control part 40 controls the transport robots TR according to the flow recipe stored in the magnetic disk 45 for executing the aforementioned substrate transportation by the two transport robots TR. Table 1 shows an exemplary flow recipe describing the procedure shown in FIG. 5.

TABLE 1

| Step | Destination of Transportation |
|------|-------------------------------|
| 1    | Heating Part                  |
| 2    | Cooling Part                  |
| 3    | Coating Part                  |
| 4    | Heating Part                  |
| 5    | Cooling Part                  |
| 6    | Exposure Unit                 |
| 7    | Post-Exposure Baking Part     |
| 8    | Cooling Part                  |
| 9    | Development Part              |
| 10   | Heating Part                  |
| 11   | Cooling Part                  |
| 12   | Indexer                       |

The operator sets/inputs the flow recipe in the control part 40 from the operation panel 51. Alternatively, the host computer provided outside the substrate processing apparatus may transmit the flow recipe shown in Table 1 to the control part 40 through the communication part 46. In either case, the magnetic disk 45 of the control part 40 stores the set/input flow recipe. The CPU 41 controls the transport robots TR to successively transport the substrates according to the flow recipe shown in Table 1, thereby implementing the aforementioned processing. According to this embodiment, the operation panel 51 corresponds to the procedure setting part, and the CPU 41 corresponds to the transportation control part.

Figure 6:
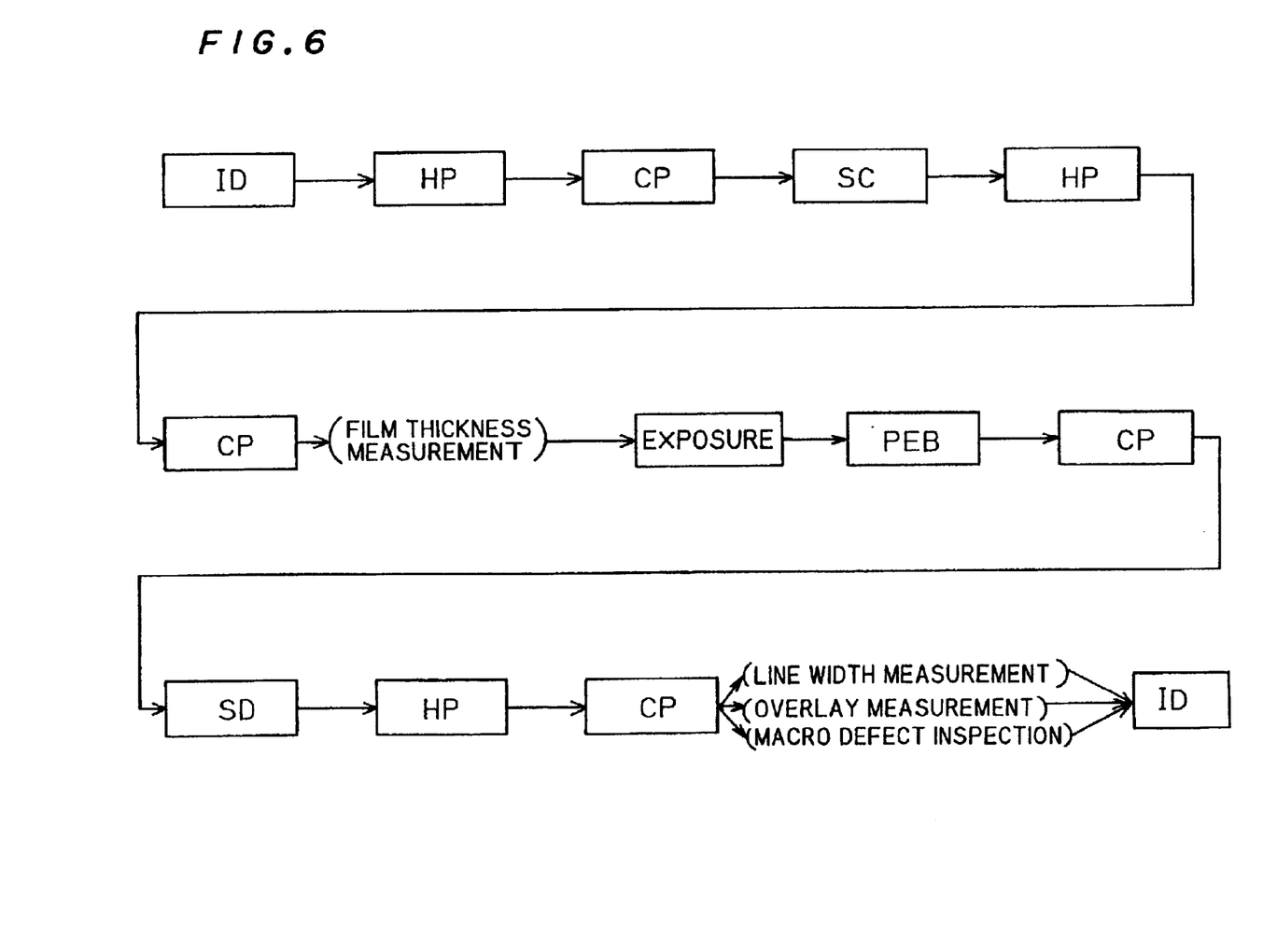
FIG. 6 illustrates an exemplary procedure in consideration of inspection steps in the substrate processing apparatus shown in FIG. 1.

The substrate processing procedure in consideration of inspection steps is now described. FIG. 6 illustrates an exemplary procedure in consideration of inspection steps in the substrate processing apparatus, prepared by adding the inspection steps to the procedure shown in FIG. 5. As described above, the inspection unit 30 according to this embodiment is provided with the four inspection parts performing substrate inspections of different contents respectively. Among the four inspections, film thickness measurement is performed before exposure processing after heat treatment following resist coating, as shown in FIG. 6. On the other hand, the remaining inspections, i.e., line width measurement, overlay measurement and a macro defect inspection are performed before the substrate is returned to the indexer ID after the post-development heat treatment.

The substrate processing apparatus according to this embodiment can selectively perform the four inspections. For example, a certain substrate may be introduced into all of the four inspection parts of the inspection unit 30 to be subjected to all inspections along the procedure shown in FIG. 6. Alternatively, the substrate may be introduced into partial inspection parts of the inspection unit 30 to be subjected to only partial inspections along the procedure shown in FIG. 6. Further, it is also possible to introduce the substrate into none of the inspection parts of the inspection unit 30 to perform absolutely no inspection on this substrate.

More concretely, a flow recipe describing a transport procedure selecting part or all of the parenthesized inspections in FIG. 6 is set for each substrate, so that the substrate is introduced into the necessary inspection part(s) and subjected to prescribed inspection(s).

The inspection(s) to be performed on each substrate can be arbitrarily set in response to the processing contents, the object etc. of the substrate. For example, it is preferable to perform all of the four inspections in order to attain complete quality maintenance. In order to attain a high throughput, on the other hand, it is desirable to reduce the number of the inspection items to the minimum. In general, it is preferable to inspect each substrate so that a properly excellent throughput and necessary and sufficient inspection(s) can be compatibly attained. The substrate processing apparatus according to this embodiment successively transports a set of plural substrates stored in a single carrier along the same procedure (excluding inspections), thereby performing the same processing. In this case, the properly excellent throughput and the necessary and sufficient inspection(s) can be compatibly attained as follows:

Assuming that a single carrier stores 25 substrates, inspection contents for the substrates are set as in Table 2:

TABLE 2

|  | 1 | 2 | 3 | 4 | 5 | 6 | --- | 23 | 24 | 25 |
|---|---|---|---|---|---|---|---|---|---|---|
| Film Thickness Measurement | 0 | — | — | — | 0 | — |  | — | — | 0 |
| Line Width Measurement | — | 0 | — | — | — | 0 |  | — | — | — |
| Overlay Measurement | — | — | 0 | — | — | — |  | 0 | — | — |
| Macro Defect Inspection | — | — | — | 0 | — | — |  | — | 0 | — |

Referring to Table 2, numerals denote wafer numbers showing the respective ones of the set of plural substrates respectively. As shown in Table 2, the first substrate is subjected to heat treatment after coated with resist, and thereafter introduced into the film thickness measuring device 32 of the inspection unit 30 to be subjected to film thickness measurement. The second substrate is subjected to heat treatment after development, and thereafter introduced into the line width measuring device 33 of the inspection unit 30 to be subjected to line width measurement. The third substrate is subjected to heat treatment after development, and thereafter introduced into the overlay measuring device 34 to be subjected to overlay measurement. The fourth substrate is subjected to heat treatment after development, and thereafter introduced into the macro defect inspection device 35 to be subjected to the macro defect inspection. Thereafter the set of plural substrates are successively subjected to any of the four inspections similarly to the above.

Thus, all of the four inspections can be successively performed on the whole of the set of plural substrates by simply adding a single step for the inspection to the basic procedure shown in FIG. 5 for each substrate. In other words, the properly excellent throughput and the necessary and sufficient inspection(s) can be compatibly attained.

The step for the inspection can be readily added to the aforementioned basic procedure from the operation panel 51. As to the second substrate shown in Table 2, for example, a flow recipe shown in Table 3 can be set by simply introducing substrate transportation to the line width measuring device 33 between steps 11 and 12 of the flow recipe shown in Table 1 as a new step 12 from the operation panel 51.

TABLE 3

| Step | Destination of Transportation |
|---|---|
| 1 | Heating Part |
| 2 | Cooling Part |
| 3 | Coating Part |
| 4 | Heating Part |
| 5 | Cooling Part |
| 6 | Exposure Unit |
| 7 | Post-Exposure Baking Part |
| 8 | Cooling Part |
| 9 | Development Part |
| 10 | Heating Part |
| 11 | Cooling Part |
| 12 | Line Width Measuring Device |
| 13 | Indexer |

The magnetic disk 45 of the control part 40 stores the set/input flow recipe. The CPU 41 controls the transport robots TR to successively transport the substrate according to the flow recipe of Table 3 set through the operation panel 51, thereby implementing the processing on the second substrate shown in Table 2.

As to the first substrate shown in Table 2, for example, a flow recipe shown in Table 4 can be set by simply introducing substrate transportation to the film thickness measuring device 32 between steps 5 and 6 of the flow recipe shown in Table 1 as a new step 6 from the operation panel 51.

TABLE 4

| Step | Destination of Transportation |
|---|---|
| 1 | Heating Part |
| 2 | Cooling Part |
| 3 | Coating Part |
| 4 | Heating Part |
| 5 | Cooling Part |
| 6 | Film Thickness Measuring Device |
| 7 | Exposure Unit |
| 8 | Post-Exposure Baking Part |
| 9 | Cooling Part |
| 10 | Development Part |
| 11 | Heating Part |
| 12 | Cooling Part |
| 13 | Indexer |

The magnetic disk 45 of the control part 40 stores the set/input flow recipe. The CPU 41 controls the transport robots TR to successively transport the substrate according to the flow recipe of Table 4 set through the operation panel 51, thereby implementing the processing on the first substrate shown in Table 2.

Thus, according to this embodiment, the four inspection parts are handled similarly to the general processing parts (the coating parts SC etc.) so that substrate transportation to the four inspection parts can be individually incorporated into arbitrary order positions in the procedure described in the flow recipe from the operation panel 51. The CPU 41 controls the transport robots TR to successively transport each substrate according to the flow recipe describing the procedure including substrate transportation to any inspection part. According to this embodiment, further, the flow recipe describing the procedure incorporating substrate transportation to any inspection part is set from the operation panel 51 every substrate, as shown in Table 2.

Thus, the substrate processing apparatus is provided therein with the four inspection parts performing substrate inspections of different contents respectively, whereby a necessary substrate inspection can be properly performed without discharging each substrate from the apparatus for the inspection. Consequently, a proper substrate inspection can be performed while suppressing reduction of the throughput. In particular, the diameter of a semiconductor substrate tends to be recently increased from 200 mm to 300 mm and it is becoming difficult to transport the substrate from the apparatus, and hence the throughput can be improved if the inspection parts are provided in the substrate processing apparatus so that inspections can be performed in the apparatus.

Further, the time required for each inspection is reduced due to provision of the inspection parts in the substrate processing apparatus. Even if inspection results are unsatisfactory, an extremely smaller number of substrates may be simply re-processed as compared with the prior art and the throughput can be further improved.

In addition, the substrate processing apparatus is provided with the four inspection parts performing substrate inspections of different contents respectively, whereby an inspection of proper contents can be properly performed at need. Even if an inspection result is unsatisfactory, the step causing the unsatisfactory result can be relatively readily specified.

Further, reduction of the throughput can be suppressed by selectively performing the four inspections. Particularly when the same procedure is performed on a set of plural substrates, a properly excellent throughput and necessary and sufficient inspections can be compatibly attained by executing the inspections shown in Table 2, for example.

According to this embodiment, it follows that a substrate transport path is formed in the substrate processing apparatus by transporting the substrates along the procedure shown in FIG. 5. More concretely, each substrate is introduced from the indexer ID into either coating unit 10, transported to the exposure unit STP through either development unit 20 and the interface IFB, returned to the development unit 20 again and thereafter returned to the indexer ID through the coating unit 10 along the transport path.

The inspection unit 30 is provided on the connecting portion between the coating units 10 and the development units 20. For example, film thickness measurement is performed before exposure processing after heat treatment following resist coating (see FIG. 6), and it follows that the film thickness measuring device 32 of the inspection unit 30 is provided on an intermediate position of the aforementioned transport path between the coating units 10 and the exposure unit STP. Further, line width measurement, overlay measurement and the macro defect inspection are performed before each substrate is returned to the indexer ID after heat treatment following development (see FIG. 6), and it follows that the line width measuring device 33, the overlay measuring device 34 and the macro defect inspection device 35 of the inspection unit 30 are provided on intermediate positions of the aforementioned transport path between the development units 20 and the indexer ID.

In other words, it follows that each of the four inspection parts is provided on an intermediate position of the aforementioned transport path responsive to the contents of its inspection. Therefore, the transport path may not be changed for inspecting the substrates but reduction of the throughput can be suppressed.

The substrate processing apparatus according to this embodiment executes processing responsive to inspection results in the four inspection parts of the inspection unit 30.

In other words, factors influencing the resist film thickness, i.e., the number of spin rotations in any coating part SC, the resist temperature, the atmosphere temperature and the temperature/humidity of the air conditioning part ACU corresponding to this coating part SC are subjected to feedback control as to the resist film thickness measured in the film thickness measuring device 32, for example. More concretely, the number of spin rotations in the coating part SC is increased if the resist film thickness measured in the film thickness measuring device 32 is larger than a target value, while the number of spin rotations in the coating part SC is reduced when the resist film thickness is smaller than the target value. Further, a baking temperature in any post-exposure baking part PEB is subjected to feed-forward control on the basis of the resist film thickness measured in the film thickness measuring device 32.

Similarly, factors influencing the line width, i.e., the baking temperature in any post-exposure baking part PEB, the developer temperature in any development part SD etc. are subjected to feedback control on the basis of the line width of the pattern measured in the line width measuring device 33.

If any inspection result in the overlay measuring device 34 is unsatisfactory, the apparatus issues an alarm of such a purport that processing in the exposure unit STP is abnormal. If any inspection result in the macro defect inspection device 35 is unsatisfactory, the apparatus issues an alarm of such a purport that any coating part SC or any development part SD is abnormal or requires exchange of the ULPA filter 16 of either air conditioning part ACU.

Thus, the substrate processing apparatus can be kept in a state stabilizing substrate processing contents by properly changing processing conditions in any of the processing parts in the substrate processing apparatus or issuing an alarm for quickly posting abnormality to the operator on the basis of the inspection result in each inspection part, while the number of substrates requiring re-processing can be suppressed to the minimum even if inspection results are unsatisfactory.

Substrate transportation to the four inspection parts can be individually incorporated into an arbitrary order position in the procedure described in the flow recipe, whereby the degree of freedom of each inspection on each substrate can be improved and a total inspection or a sampling inspection of the substrates can be readily performed.

Modifications

Figure 7:
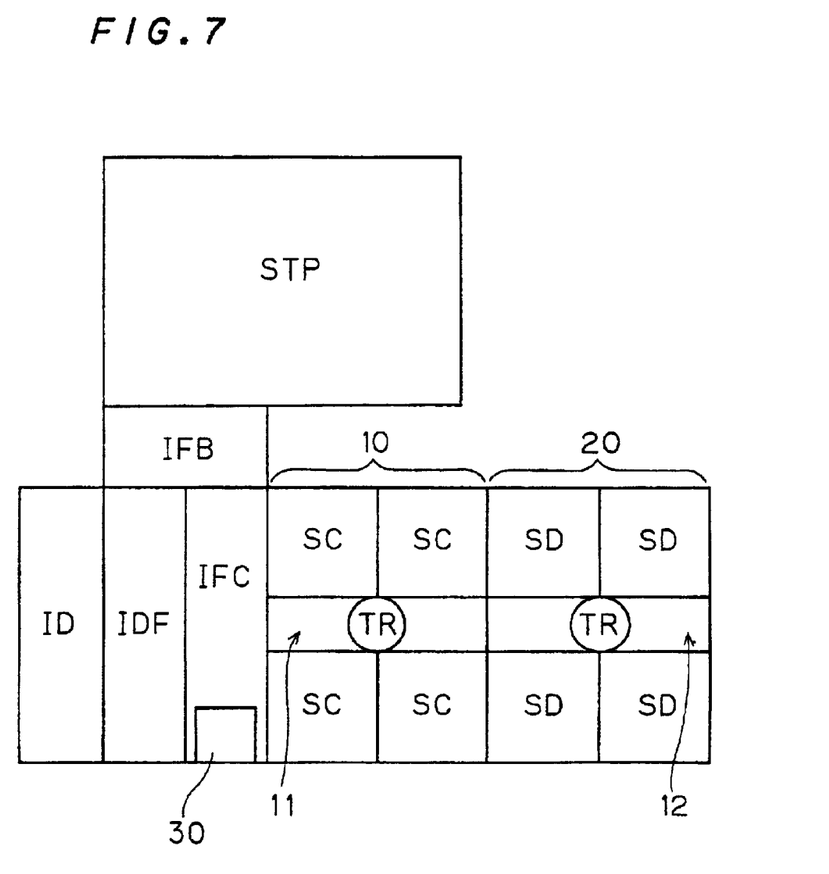
FIG. 7 is a plan view showing another exemplary arrangement/structure of the substrate processing apparatus according to the present invention.

While the embodiment of the present invention has been described, the present invention is not restricted to the aforementioned embodiment. For example, the substrate processing apparatus arranged/formed as shown in FIG. 1 in the aforementioned embodiment may alternatively be arranged/formed as shown in FIG. 7. Referring to FIG. 7, elements having the same reference numerals as those in FIG. 1 have similar functions, and hence redundant description is omitted. Among the elements forming the substrate processing apparatus shown in FIG. 7, that absent in the apparatus shown in FIG. 1 is an interface IFC. The interface IFC is provided with a transfer robot (not shown) and an inspection unit 30. The interface IFC transfers substrates between an indexer transfer part IDF, an interface IFB and coating units 10, while introducing/discharging the substrates into/from the inspection unit 30.

The substrate processing apparatus shown in FIG. 7 is different in unit arrangement from the apparatus shown in FIG. 1, such that an exposure unit STP is arranged on a side portion of the substrate processing apparatus through the interface IFB. The basic procedure in the substrate processing apparatus shown in FIG. 7 is identical to that shown in FIG. 5. However, a transport path formed in the substrate processing apparatus is different from that of the apparatus shown in FIG. 1 due to the different unit arrangement. More concretely, each substrate is introduced into either coating unit 10 from the indexer ID through the indexer transfer part IDF and the interface IFC, carried to the exposure unit STP through the interfaces IFC and IFB again, further transported to either development unit 20 through the interfaces IFB and IFC and either coating unit 10, and thereafter returned to the indexer ID through the coating unit 10 along the transport path.

The substrate processing apparatus shown in FIG. 7 is also provided with four inspection parts performing substrate inspections of different contents respectively, whereby an effect similar to that of the aforementioned substrate processing apparatus shown in FIG. 1 can be attained. In other words, an effect similar to that of the aforementioned embodiment can be attained by providing a plurality of inspection parts performing substrate inspections of different contents respectively regardless of the unit arrangement.

In the apparatus shown in FIG. 7, the inspection unit 30 is provided on the interface IFC, and it follows that a film thickness inspection device 32 is provided on an intermediate position of the aforementioned transport path between the coating units 10 and the exposure unit STP. Further, it follows that a line width measuring device 33, an overlay measuring device 34 and a macro defect inspection device 35 are provided on intermediate positions of the aforementioned transport path between the development units 20 and the indexer ID. In other words, it follows that four inspection parts are arranged on intermediate positions of the aforementioned transport path responsive to the contents of the inspections thereof, similarly to the substrate processing apparatus shown in FIG. 1. Therefore, the transport path may not be changed for inspecting the substrates but reduction of the throughput can be suppressed.

Figure 8:
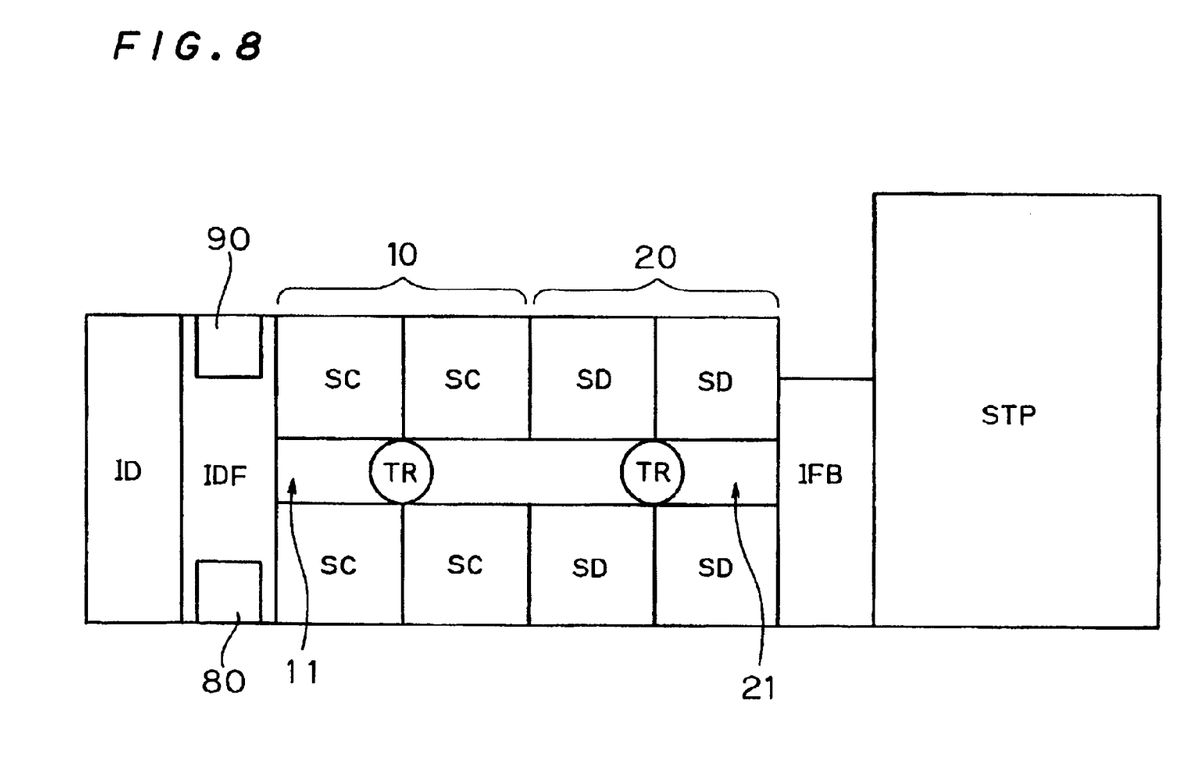
FIG. 8 is a plan view showing still another exemplary arrangement/structure of the substrate processing apparatus according to the present invention.

A substrate processing apparatus having arrangement/structure shown in FIG. 8 may be also employed. Referring to FIG. 8, elements denoted by the same reference numerals as those in FIG. 1 have similar functions, and hence redundant description is omitted. The substrate processing apparatus shown in FIG. 8 is different from that shown in FIG. 1 in a point that an indexer transfer part IDF is provided with two inspection parts 80 and 90 in place of the inspection unit 30. The inspection part 80 can perform resist film thickness measurement, pattern line width measurement and pattern overlay measurement. In other words, the inspection part 80 has the functions of the aforementioned three inspection parts, i.e., the film thickness measuring device 32, the line width measuring device 33 and the overlay measuring device 34. On the other hand, the inspection part 90, identical to the aforementioned macro defect inspection device 35, performs determination (macro defect inspection) on presence/absence of a relatively large defect appearing on each substrate such as adhesion of particles, for example.

A substrate transfer robot provided on the indexer transfer part IDF transfers substrates to the inspection parts 80 and 90. In other words, this substrate transfer robot and transport robots TR function as transport parts. When an inspection step is incorporated into a flow recipe in the substrate processing apparatus shown in FIG. 8, substrate transportation to the inspection part 80 and/or the inspection part 90 is individually incorporated into an arbitrary order position in a procedure described in the flow recipe from an operation panel 51. As to what kind of inspection is performed, another recipe is transferred to the inspection part 80 when substrate transportation to the inspection part 80 is incorporated into the flow recipe. Also in this case, a necessary substrate inspection can be properly performed without discharging each substrate from the apparatus for the inspection, due to the provision of the inspection parts 80 and 90 performing substrate inspections in the substrate processing apparatus. Consequently, a proper substrate inspection can be performed while suppressing reduction of the throughput. Further, substrate transportation to either inspection part 80 or 90 can be incorporated into an arbitrary order position in the procedure described in the flow recipe, whereby the degree of freedom of the inspection on each substrate can be improved.

While the development parts SD, the coating parts SC, the cooling parts CP, the heating parts HP and the post-exposure baking parts PEB are generically referred to as processing parts in the aforementioned embodiment, the processing parts are not restricted to these but can be properly combined in response to the processing contents of the apparatus. For example, the processing parts may include an edge exposure part exposing edges of the substrates, a cleaning part performing surface cleaning of the substrates with a brush or the like etc.

While the substrate processing apparatus is provided with four inspection parts performing substrate inspections of different contents respectively in the aforementioned embodiment, at least one inspection part may be provided in response to necessary inspection contents. The inspection contents in the inspection parts are not restricted to those in the aforementioned embodiment either, as a matter of course.

Also when a single inspection part is provided, the degree of freedom of an inspection on each substrate can be improved by incorporating substrate transportation to the inspection part into an arbitrary order position in a procedure described in a flow recipe so that a CPU 41 controls the transport robots TR to successively transport the substrate along the flow recipe.

While the aforementioned embodiment successively performs one of the four inspections as to each of a set of plural substrates when successively transporting the set of plural substrates along the same procedure, the present invention is not restricted to this but each of part or all of a set of plural substrates may be transported to a single inspection part selected from four inspection parts so that at least one of the set of plural substrates is transported to each of the four inspection parts. Thus, all inspections can be performed by simply adding some inspection steps, so that a properly excellent throughput and necessary and sufficient inspections can be compatibly attained.

While the four inspection parts are stacked to be planarly arranged on a single portion in the aforementioned embodiment, the mode of arrangement of the four inspection parts is not restricted to this but the four inspection parts can be provided on arbitrary positions in the apparatus while the four inspection parts may not be stacked but provided on different positions. However, the inspection parts are preferably arranged on intermediate positions of the transport path responsive to the inspection contents thereof, in order to suppress reduction of the throughput.

While the substrate processing apparatus according to the aforementioned embodiment sets the flow recipe describing the procedure including substrate transportation to any inspection part from the operation panel 51 every substrate, a flow recipe describing a procedure including substrate transportation to any inspection part may alternatively be set every carrier loaded on the indexer ID, for example, for a prescribed number of substrates. Assuming that the flow recipe shown in Table 3, for example, is set for a certain carrier in this case, the CPU 41 controls the transport robots TR to sucessively transport all substrates stored in the carrier according to the flow recipe shown in Table 3.

Substrate transportation to the four inspection parts can be individually incorporated into arbitrary order positions in the procedure described in the flow recipe from the operation panel 51, and hence a flow recipe including at least two inspection contents may be set. When incorporating substrate transportation to the film thickness measuring device 32 between the steps 5 and 6 of the flow recipe shown in Table 1 as a new step 6 while incorporating substrate transportation to the line width measuring device 33 between the steps 11 and 12, for example, a flow recipe shown in Table 5 can be set:

TABLE 5

| Step | Destination of Transportation |
|---|---|
| 1 | Heating Part |
| 2 | Cooling Part |
| 3 | Coating Part |
| 4 | Heating Part |
| 5 | Cooling Part |
| 6 | Film Thickness Measuring Device |
| 7 | Exposure Unit |
| 8 | Post-Exposure Baking Part |
| 9 | Cooling Part |
| 10 | Development Part |
| 11 | Heating Part |
| 12 | Cooling Part |
| 13 | Line Width Measuring Device |
| 14 | Indexer |

The CPU 41 controls the transport robots TR to successively transport substrates according to the flow recipe shown in Table 5, so that resist film thickness measurement and pattern line width measurement can be executed.

While the substrate processing apparatus according to the aforementioned embodiment sets the flow recipe including substrate transportation to any inspection part from the operation panel 51, the present invention is not restricted to this but a flow recipe including substrate transportation to any inspection part may be set from the host computer, for example, provided outside the substrate processing apparatus and transported through the communication part 46 to be stored in the magnetic disk 45 of the control part 40.

While the substrate processing apparatus according to the aforementioned embodiment performs resist coating processing and development processing on the substrates and the inspection unit 30 has a function of performing inspections related to the so-called photolithography, the inventive technique is not restricted to this. For example, an inspection part having an inspective function of measuring amine or ammonia concentration may be employed. Further, an inspection part performing a particle inspection may be arranged on a substrate processing apparatus (the so-called spin scrubber or the like) removing particles etc. adhering to substrates. In addition, an apparatus applying SOD (spin-on-dielectrics) to substrates and forming interlayer isolation films may be provided with an inspection part inspecting fired states of the interlayer isolation films. Further, an inspection part may be arranged on a substrate processing apparatus receiving a substrate processed in another substrate processing apparatus, inspecting the same and feed-forwarding the inspection results to processing conditions. In any case, an inspection part performing a substrate inspection is provided in the substrate processing apparatus, whereby a necessary substrate inspection can be properly performed without discharging the substrate from the apparatus for the inspection. Consequently, a proper substrate inspection can be performed while suppressing reduction of the throughput. Further, the degree of freedom of the inspection on each substrate can be improved by incorporating substrate transportation to any inspection part into an arbitrary order position in the procedure described in the flow recipe.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus for performing resist coating processing and development processing on a substrate, comprising:
    a) a coating unit provided with a first plurality of processing parts including a coating part for performing resist coating processing on a substrate;
    b) a development unit provided with a second plurality of processing parts including a development part for performing development processing on a substrate;
    c) an inspection unit provided with a plurality of inspection parts for performing substrate inspection of different contents respectively, said inspection unit being arranged between said coating unit and said development unit;
    d) a transport part for transporting a substrate to said first plurality of processing parts, said second plurality of processing parts and said plurality of inspection parts; and
    e) a transportation control part for controlling said transport part so that each of part oR all of a set of plural substrates subjected to the same processing is transported to a single inspection part selected from said plurality of inspection parts, thereby transporting at least one and less than all of said set of plural substrates to each of said plurality of inspection parts.

2. The substrate processing apparatus according to claim 1, further comprising:
    f) an indexer for introducing unprocessed substrates and receiving processed substrates,
    wherein said transportation control part controls said transport part so that a substrate introduced from said indexer into said coating unit and coated with resist is passed through said development unit and is transported outside said substrate processing apparatus, and also that a substrate exposed outside said substrate processing apparatus and thereafter returned to said development unit and developed is passed through said coating unit and is transported to said indexer.

3. The substrate processing apparatus according to claim 2, wherein said transport part includes:
    a first transport robot provided in said coating unit for transporting a substrate to said first plurality of processing parts; and
    a second transport robot provided in said development unit for transporting a substrate to said second plurality of processing parts,
    wherein both said first transport robot and said second transport robot are capable of transporting a substrate to said inspection unit.

4. The substrate processing apparatus according to claim 3, wherein a processing condition in any processing part of said first and second plurality of processing parts is changed on the basis of inspection results obtained by said plurality of inspection parts.

5. The substrate processing apparatus according to claim 4, wherein said plurality of inspection parts include at least two of a resist film thickness measuring part, a pattern line width measuring part, a pattern overlay measuring part and a macro defect inspection part.

6. A substrate processing apparatus for performing resist coasting processing and development processing on a substrate, comprising:
   a) a coating unit provided with a first plurality of processing parts including a coating part for performing resist coating processing on a substrate;
   b) a development unit provided with a second plurality of processing parts including a development part for performing development processing on a substrate;
   c) an inspection unit provided with an inspection part capable of performing substrate inspection of a plurality of contents, said inspection unit being arranged between said coating unit and said development unit;
   d) a transport part for transporting a substrate to said first plurality of processing parts, said second plurality of processing parts and said inspection part; and
   e) a transportation control part for controlling said transport part so that each of part or all of a set of plural substrates subjected to the same processing is transported to said inspection part,
   wherein a substrate transported to said inspection part undergoes substrate inspection of a single content selected from said plurality of contents that said inspection part is capable of performing, so that said inspection part performs substrate inspection of each of said plurality of contents on at least one and less than all of said set of plural substrates.

7. The substrate processing apparatus according to claim 6, further comprising:
   f) an indexer for introducing unprocessed substrates and receiving processed substrates,
   wherein said transportation control part controls said transport part so that a substrate introduced from said indexer into said coating unit and coated with resist is passed through said development unit and is transported outside said substrate processing apparatus, and also that a substrate exposed outside said substrate processing apparatus and thereafter returned to said development unit and developed is passed through said coating unit and is transported to said indexer.

8. The substrate processing apparatus according to claim 7, wherein said plurality of contents that said inspection part is capable of performing comprises resist film thickness measurement, pattern line width measurement and pattern overlay measurement.

9. A substrate processing system for performing resist coating processing and development processing on a substrate, comprising:
   a) a coating unit provided with a first plurality of processing parts including a coating part for performing resist coating processing on a substrate;
   b) a development unit provided with a second plurality of processing parts including a development part for performing development processing on a substrate;
   c) an inspection unit provided with a plurality of inspection parts for performing substrate inspection of different contents respectively, said inspection unit being arranged between said coating unit and said development unit;
   d) a transport part for transporting a substrate to said first plurality of processing parts, said second plurality of processing parts and said plurality of inspection parts;
   e) an indexer provided to be connected to said coating unit for introducing unprocessed substrates and receiving processed substrates;
   f) an exposure unit provided to be connected to said development unit for performing exposure processing to a substrate coated with resist; and
   g) a transportation control part for controlling said transport part so that each of part oR all of a set of plural substrates subjected to the same processing is transported to a single inspection part selected from said plurality of inspection parts, thereby transporting at least one and less than all of said set of plural substrates to each of said plurality of inspection parts.

10. The substrate processing system according to claim 9, wherein said plurality of inspection parts include at least two of a resist film thickness measuring part, a pattern line width measuring part, a pattern overlay measuring part and a macro defect inspection part.

11. A substrate processing system for performing resist coating processing and development processing on a substrate, comprising:
   a) a coating unit provided with a first plurality of processing parts including a coating part for performing resist coating processing on a substrate;
   b) a development unit provided with a second plurality of processing parts including a development part for performing development processing on a substrate;
   c) an inspection unit provided with an inspection part capable of performing substrate inspection of a plurality of contents, said inspection unit being arranged between said coating unit and said development unit;
   d) a transport part for transporting a substrate to said first plurality of processing parts, said second plurality of processing parts and said inspection part;
   e) an indexer provided to be connected to said coating unit for introducing unprocessed substrates and receiving processed substrates;
   f) an exposure provided to be connected to said development unit for performing exposure processing to a substrate coated with resist; and
   g) a transportation control part for controlling said transport part so that each of parts or all of a set of plural substrates subjected to the same processing is transported to said inspection part,
   wherein a substrate transported to said inspection part undergoes substrate inspection of a single content selected from said plurality of contents that said inspection part is capable of performing, so that said inspection part performs substrate inspection of each of said plurality of contents on at least one and less than all of said set of plural substrates.

12. The substrate processing system according to claim 11, wherein said plurality of contents that said inspection part is capable of performing comprises resist film thickness measurement, pattern line width measurement and pattern overlay measurement.

* * * * *